US011733269B2

(12) United States Patent
Cho

(10) Patent No.: US 11,733,269 B2
(45) Date of Patent: Aug. 22, 2023

(54) SEMICONDUCTOR FABRICATING APPARATUS INCLUDING A PROBE STATION

(71) Applicant: SK hynix Inc., Gyeonggi-do (KR)

(72) Inventor: Jun-Kyu Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 217 days.

(21) Appl. No.: 17/149,436

(22) Filed: Jan. 14, 2021

(65) Prior Publication Data

US 2021/0255219 A1 Aug. 19, 2021

(30) Foreign Application Priority Data

Feb. 19, 2020 (KR) .................. 10-2020-0020557
Jun. 30, 2020 (KR) .................. 10-2020-0079998

(51) Int. Cl.
*G01R 1/02* (2006.01)
*G01R 1/04* (2006.01)
*G01R 1/067* (2006.01)
*G01R 1/073* (2006.01)
*G01R 31/12* (2020.01)
*G01R 31/26* (2020.01)
*G01R 31/28* (2006.01)

(52) U.S. Cl.
CPC ..... *G01R 1/07364* (2013.01); *G01R 31/2601* (2013.01)

(58) Field of Classification Search
CPC . G01R 1/02; G01R 1/04; G01R 1/067; G01R 1/073; G01R 1/16; G01R 31/12; G01R 31/26; G01R 31/28; G01R 31/31
See application file for complete search history.

(56) References Cited

U.S. PATENT DOCUMENTS

2012/0038382 A1* 2/2012 Umemura .......... G01R 1/07378
324/755.09
2012/0074974 A1* 3/2012 Sato ................... G01R 31/2887
324/750.16

FOREIGN PATENT DOCUMENTS

KR 10-1642749 8/2016

* cited by examiner

*Primary Examiner* — Neel D Shah
(74) *Attorney, Agent, or Firm* — IP & T Group LLP

(57) ABSTRACT

A semiconductor fabricating apparatus may include a probe card, a test head, a support and a chamber wall. The probe card may include a plurality of probing needles. The probe card may be installed at the test head. The support may be configured to receive a wafer including a plurality of test pads making contact with the probing needles. The chamber wall may be configured to receive the support. The chamber wall may define a chamber in which a probe test may be performed. At least one of the probe card and the support, the probe card and the test head, and the test head and the chamber wall may be combined with each other by a magnetic module.

15 Claims, 9 Drawing Sheets

SEMICONDUCTOR FABRICATING APPARATUS INCLUDING A PROBE STATION

CROSS-REFERENCES TO RELATED APPLICATION

The present application claims priority under 35 U.S.C. § 119(a) to Korean application number 10-2020-0079998, filed on Jun. 30, 2020 and Korean application number 10-2020-0020557, filed on Feb. 19, 2020, which are incorporated herein by reference in their entirety.

BACKGROUND

1. Technical Field

Various embodiments generally relate to a semiconductor fabricating apparatus and, more particularly, to a semiconductor fabricating apparatus configured to combine elements of a probe station with each other.

2. Related Art

Generally, a plurality of semiconductor chips may be arranged on a semiconductor substrate. A plurality of electronic elements and a plurality of pads electrically connected to the electronic elements may be formed in each of the semiconductor chips by various processes. The electronic elements may be electrically connected with the pads to input/output electrical signals between the electronic elements and the pads.

The semiconductor chip with the electronic elements may be packaged to form an electronic device. Before packaging, the semiconductor chip may be tested to identify whether the electronic elements are normally integrated or not. This test may be referred to as a wafer level test.

The wafer level test may be performed by a probe test apparatus and may be referred to hereinafter as a probe test. The probe test may include electrically contacting the pads of the semiconductor chip with probes of the probe test apparatus to determine whether the electronic elements are normal or not.

In order to accurately perform the probe test, it may be required to accurately contact the probe with the pad. Thus, in the probe test apparatus, it may be required to provide the probes on the pads with a uniform contact force.

SUMMARY

In various embodiments of the present disclosure, a semiconductor fabricating apparatus may include a probe card, a test head, a support and a chamber wall. The probe card may include a plurality of probing needles. The probe card may be installed at the test head. The support may be configured to receive a wafer including a plurality of test pads making contact with the probing needles. The chamber wall may be configured to receive the support. The chamber wall may define a chamber in which a probe test may be performed. At least one of the probe card and the support, the probe card and the test head, and the test head and the chamber wall may be combined with each other by a magnetic module.

In various embodiments of the present disclosure, a semiconductor fabricating apparatus may include a probe card, a support, a magnetic force generator, a selective contactor and a controller. The probe card may include a needle region including a plurality of probe needles and an edge region configured to surround the needle region. The support may include a supporting portion configured to support a wafer including a plurality of test pads and an edge portion configured to surround the supporting portion. The magnetic force generator may be arranged in the edge region of the probe card by a uniform gap. The selective contactor may be arranged in the edge portion of the support facing the magnetic force generator. The controller may be connected to the magnetic force generator to selectively generate an attractive force and a repulsive force between the magnetic force generator and the selective contactor.

In various embodiments of the present disclosure, a semiconductor fabricating apparatus may include a probe card, a test head, a magnetic force generator and a controller. The probe card may have a first surface and a second surface. The first surface may include a needle region including a plurality of probe needles and an edge region configured to surround the needle region. The second region may include a plurality of connectors arranged in a circumferential direction of the probe card by a uniform gap. The test head may include a receiver configured to receive the probe card. The magnetic force generator may be arranged in the receiver corresponding to at least one selected from the connectors. The controller may be connected to the magnetic force generator to selectively generate an attractive force and a repulsive force between the magnetic force generator and the connector corresponding to the magnetic force generator.

In various embodiments of the present disclosure, a semiconductor fabricating apparatus may include a test head, a chamber wall, a magnetic force generator, a selective contactor and a controller. The test head may be configured to receive a probe card. The chamber wall may be configured to receive one surface of the test head to define a chamber where the chamber wall may be combined with the test head. The magnetic force generator may be installed at the test head opposite to the chamber wall. The selective contactor may be arranged at the chamber wall opposite to the magnetic force generator. The controller may be connected to the magnetic force generator to selectively generate an attractive force and a repulsive force between the magnetic force generator and the selective contactor.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of embodiments of the present invention. However, embodiments of the present invention should not be construed as limiting the disclosure. Although a few embodiments of the present invention will be shown and described, it will be appreciated by those of ordinary skill in the art that changes may be made in these embodiments without departing from the principles and spirit of the present invention.

Figure 1:
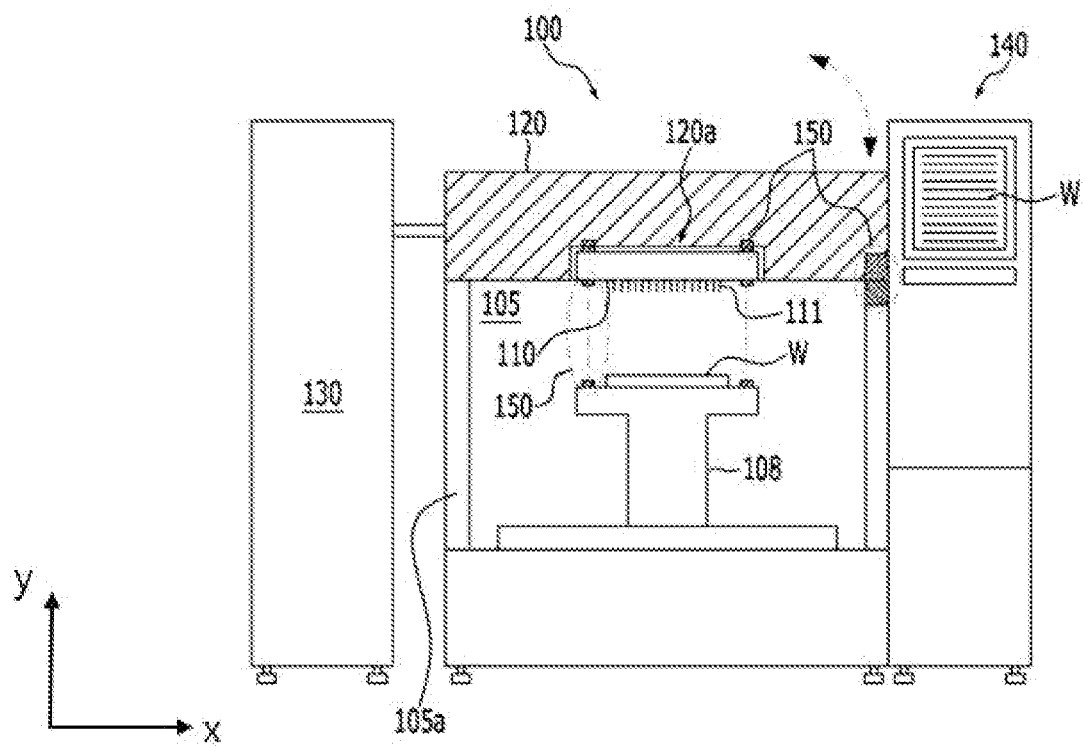
FIG. 1 is a view illustrating a probe station in accordance with an embodiment of the present disclosure.

FIG. 1 is a view illustrating a probe station in accordance with an embodiment of the present disclosure.

Referring to FIG. 1, a probe station 100 may include a test chamber 105, a probe card 110, a test head 120 and a tester 130.

The test chamber 105 may be defined by a chamber wall 105a. The test chamber 105 may be configured to define a space where an electrical test may be performed on a wafer W. The test chamber 105 may include a support 108 configured to support the wafer W. The support 108 may be moved in an x-direction and a y-direction. Further, the support 108 may be rotated to accurately align the wafer W with the probe card 110. Although not depicted in the drawings, the support 108 may include a temperature controller positioned on an upper surface of the support 108 on which the wafer W may be placed. Thus, a temperature of the wafer W may be controlled by the temperature controller during a test process.

The test chamber 105 may have an opened upper surface. The opened upper surface of the test chamber 105 may be sealed by the test head 120.

The test head 120 may be configured to hermetically seal the test chamber 10 however other sealing configurations may be used. For example, one surface of the test head 120 may be mechanically combined with one surface of the test chamber 105. Other surfaces of the test head 120 may be selectively opened or closed by an upper surface of the chamber wall 105a in the test chamber 105.

The test head 120 may include receiver 120a. The receiver 120a may be positioned opposite to the support 108 on which the wafer W may be placed. The probe card 110 may be installed at the receiver 120a. The probe card 110 may be selectively installed at the receiver 120a of the test head 120 by a magnetic force.

The probe card 110 may provide the wafer W with various electrical signals for testing the wafer W. The probe card 110 may include a plurality of probing needles 111. The probing needles 111 may make contact with test pads of the wafer W to measure electrical characteristics of semiconductor elements in the wafer W. The probing needles 111 of the probe card 110 may selectively make contact with the test pads by the magnetic force without a driving force.

The tester 130 may be electrically and mechanically connected to the test head 120. The tester 130 may generate a test pattern or a test signal. The test pattern or the test signal may be transmitted to the probe card 110 through the test head 120. The test head 120 may determine whether the semiconductor elements are normal or not using information of the semiconductor elements obtained from the probe card 110.

The probe station 100 may further include a loader 140. The loader 140 may be arranged at one side of the test chamber 105 to receive the wafer W to be tested or a tested wafer W.

Figure 2:
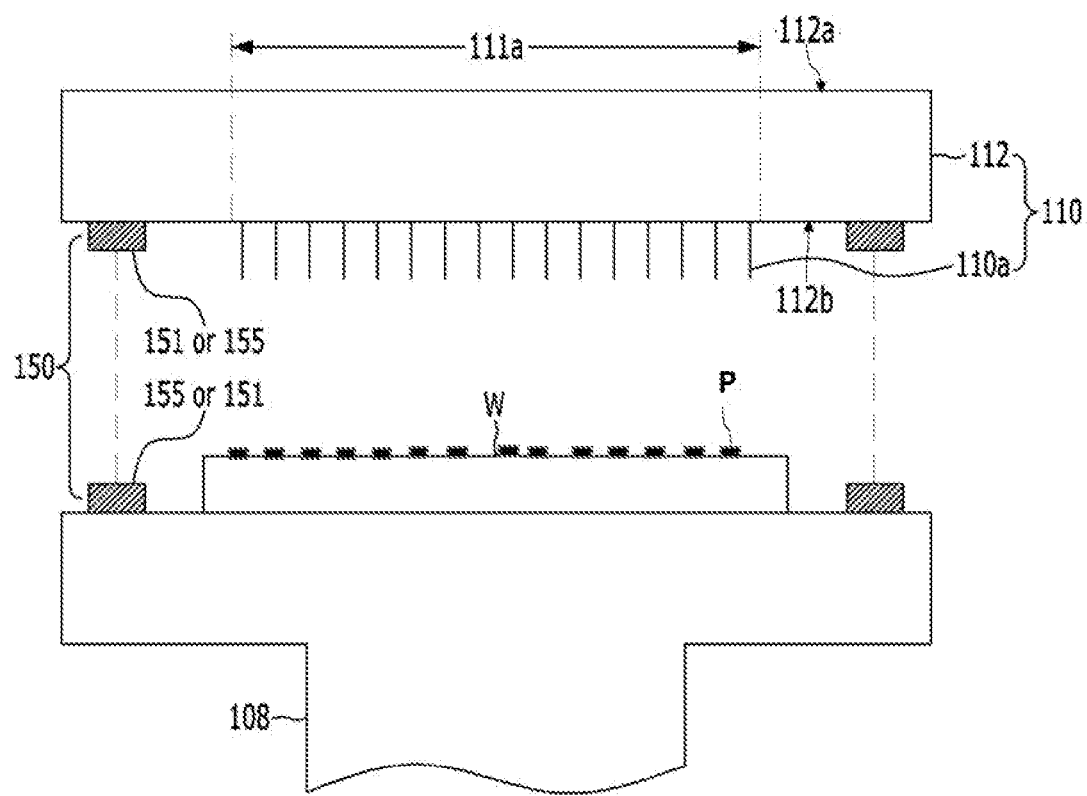
FIG. 2 is a cross-sectional view illustrating a probe card and a support in accordance with an embodiment of the present disclosure.
Figure 3:
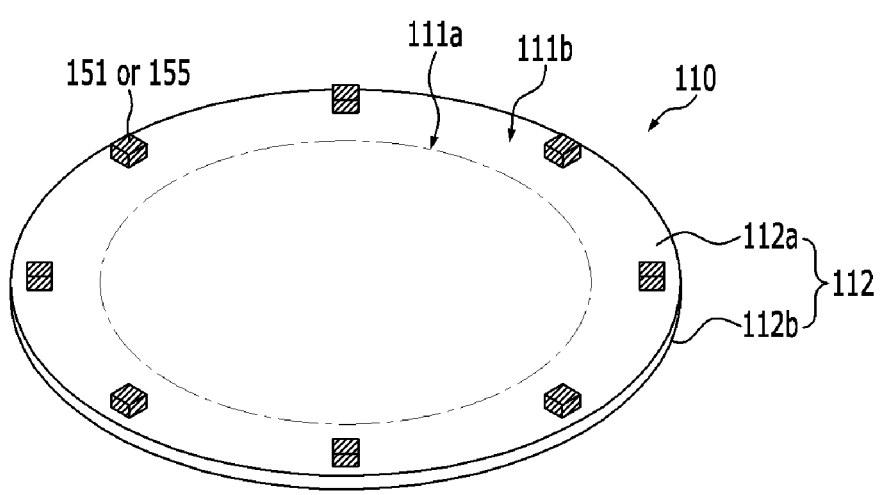
FIG. 3 is a bottom view illustrating a probe card in accordance with an embodiment of the present disclosure.

FIG. 2 is a cross-sectional view illustrating a probe card and a support in accordance with an embodiment of the present disclosure. FIG. 3 is a bottom view illustrating a probe card in accordance with an embodiment of the present disclosure, and FIG. 4 is a perspective view illustrating a support in accordance with an embodiment of the present disclosure.

Figure 4:
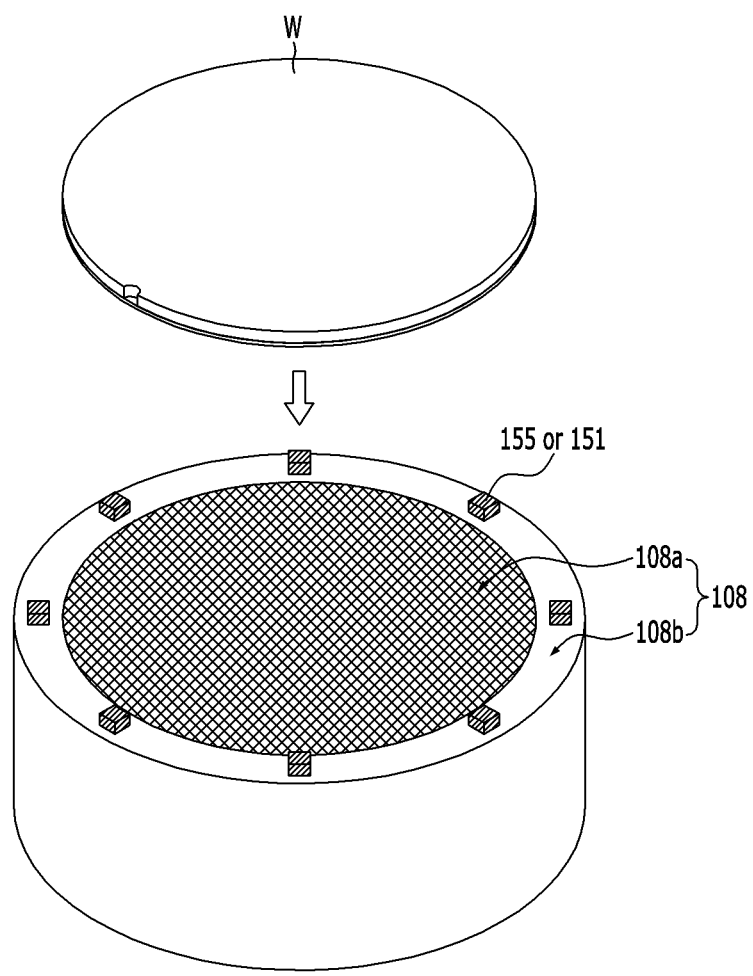
FIG. 4 is a perspective view illustrating a support in accordance with an embodiment of the present disclosure.

Referring to FIGS. 2 to 4, the probe card 110 may be arranged facing the support 108.

A magnetic module 150 may be arranged at an edge portion of the probe card 110 and an edge portion of the support 108.

The magnetic module 150 may include a magnetic force generator 151 and a selective contactor 155. The magnetic module 150 may include a pair of the magnetic force generators 151 and a pair of the selective contactors 155. For example, when the magnetic force generator 151 is positioned in the probe card 110, the selective contactor 155 may be arranged at the support 108. When the selective contactor 155 is positioned in at the probe card 110, the magnetic force generator 151 may be arranged at the support 108.

For example, the probe card 110 may include a probe substrate 112. At a surface of the probe substrate the probing needles 111 may be fixed. The probe substrate 112 may have a first surface 112a and a second surface 112b (See FIG. 3). The first surface 112a may face the support 108. The second surface 112b may make contact with the test head 120. Most regions of the first surface 112a except for an edge portion may be defined as a probing region 111a into which the probing needles 111 are inserted. Any one of the magnetic force generator 151 and the selective contactor 155 may be positioned in a peripheral region of the probing region 111a, i.e., an edge region 111b of the first surface 111a. Any one of the magnetic force generator 151 and the selective contactor 155 in the edge region 111b of the probe card 110 may be arranged by a uniform gap along a circumferential direction of the probe card 110.

The upper surface of the support 108 may have a wafer supporting region 108a and a peripheral region 108b. For example, the wafer supporting region 108a may be configured to fix the wafer W using an electrostatic attractive force. The peripheral region 108b may be configured to surround the wafer supporting region 108a.

The other one of the magnetic force generator 151 and the selective contactor 155 in the magnetic module 150 may be arranged in the peripheral region 108b of the support 108 by a uniform gap. The other one of the magnetic force generator 151 and the selective contactor 155 in the peripheral region 108b of the support 108 may be arranged corresponding to any one of the magnetic force generator 151 and the selective contactor 155 in the edge region 111b of the probe card 110 to selectively contact the probe card 110 with the wafer W on the support 108.

Figure 5A:
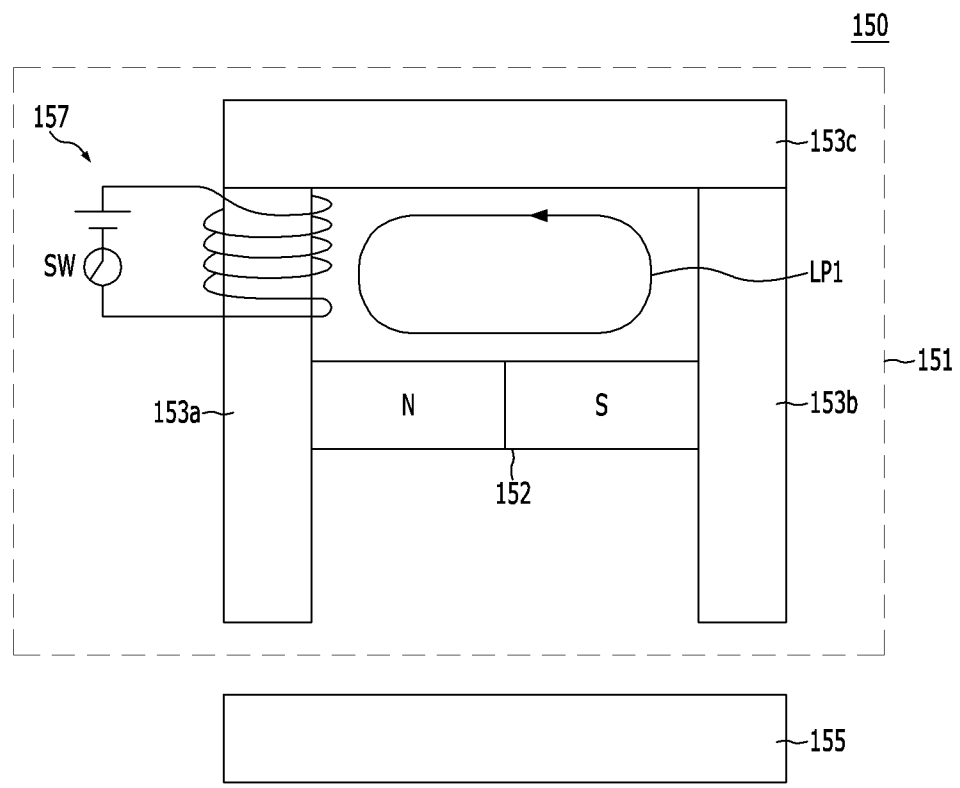
FIGS. 5A and 5B are cross-sectional views illustrating a magnetic module in accordance with an embodiment of the present disclosure.
Figure 5B:
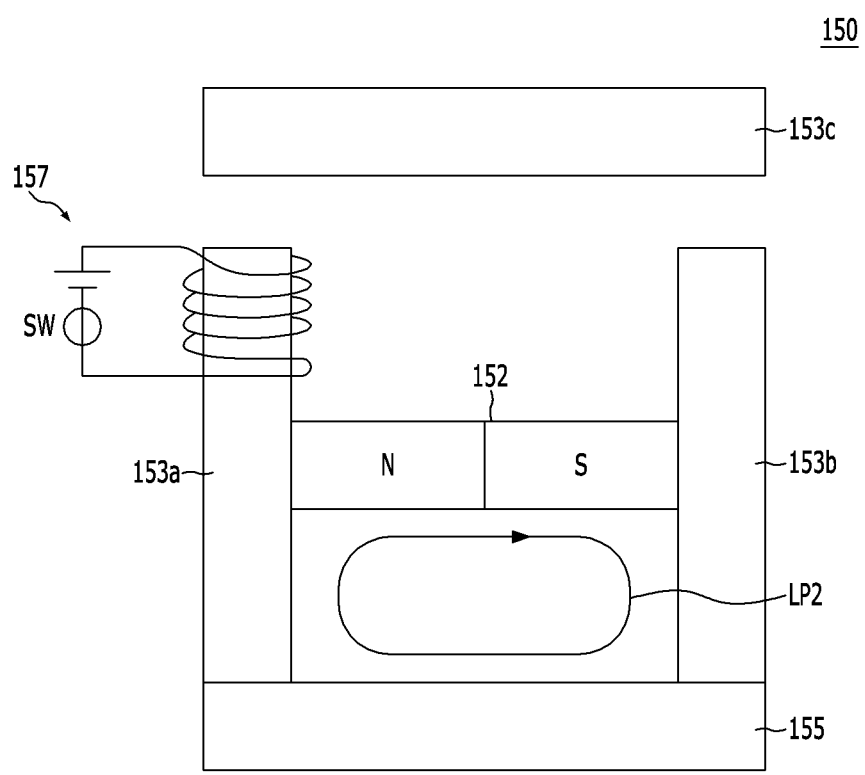

FIGS. 5A and 5B are cross-sectional views illustrating a magnetic module in accordance with an embodiment of the present disclosure.

Referring to FIGS. 5A and 5B, the magnetic module 150 may include the magnetic force generator 151, the selective contactor 155 and a controller 157.

The magnetic force generator 151 may include a magnet 152, a first block 153a, a second block 153b and a third block 153c. As mentioned above, the magnetic force generator 151 may be arranged at the edge portion 111b of the probe card 110.

For example, the magnet 152 may include a permanent magnet. The permanent magnet may preserve a strong magnetization state for a long time. The permanent magnet may generate and maintain a stable magnetic field without external electric energy. The magnet 152 may have a north pole and a south pole.

Each of the first to third blocks 153a, 153b and 153c may include a conductive material, for example, a metal.

The first block 153a may make contact with the north pole of the magnet 152. The second block 153b may make contact with the south pole of the magnet 152. The first block 153a and the second block 153b may make contact with the magnet 152 so that the first block 153a and the second block 153b may have polarities.

For example, the first block 153a making contact with the north pole of the magnet 152 may be charged with a polarity substantially the same as the north pole. The second block 153b making contact with the south pole of the magnet 152 may be charged with a polarity substantially the same as the south pole.

When the third block 153c approaches first ends of the first and second blocks 153a and 153b, the third block 153c may be fixed to the first ends of the first and second block 153a and 153b by magnetic forces of the first and second magnetic forces 153a and 153b.

Therefore, a first closed loop LP1 may be formed between the magnet 152 and the first to third blocks 153a, 153b and 153c. Because the first to third blocks 153a, 153b and 153c as well as the magnet 152 may have the magnetic forces, a magnetic flux may be generated in the first closed loop LP1. Thus, a magnetic circuit may be formed between the magnet 152 and the first to third blocks 153a, 153b and 153c. In various embodiments, when the magnetic force generator 151 does not make contact with the selective contactor 155, the third block 153c may make contact with the first and second blocks 153a and 153b.

For example, the selective contactor 155 may be arranged at the peripheral region 108a of the support 108. The selective contactor 155 may include a metal similar to the first to third blocks 153a, 153b and 153c. The selective contactor 155 may be arranged at the second ends of the first and second blocks 153a and 153b. When the third block 153c makes contact with first ends of the first and second blocks 153a and 153b, a repulsive force may be generated between the selective contactor 155 and the second ends of the first and second blocks 153a and 153b. This may be caused by the magnetic circuit by the first closed loop LP1.

The controller 157 may open the first closed loop LP1 to attach the selective contactor 155 to the magnetic force generator 151. The controller 157 may generate a magnetic force having a magnetic field line opposite to a magnetic field line of the first closed loop LP1. For example, the controller 157 may include a voltage source and a coil connected to the voltage source. The coil may be wound on the first block 153a or the second block 153b. The coil may be wound in a direction for generating the magnetic field line opposite to the magnetic field line of the first close loop LP1. When the voltage source applies a voltage to the coil, a current may be generated from the coil to generate the magnetic force having the magnetic field line opposite to the magnetic field line of the first close loop LP1. Thus, the magnetic force for generating the first close loop LP1 may be weakened to detach the third block 153c from the first ends of the first and second blocks 153a and 153b. In contrast, the magnetic force having the magnetic field line opposite to the magnetic field line of the first closed loop LP1 may be increased to attach the selective contactor 155 to the second ends of the first and second blocks 153a and 153b. Therefore, a second closed loop LP2 having the magnetic field line opposite to the magnetic field line of the first close loop LP1 may be formed between the magnet 152, the first block 153a, the second block 153b and the selective contactor 155. The second closed loop LP2 may be formed by the magnetic force provided from the controller 157 as well as the magnetic force of the magnet 152. Thus, the first and second blocks 153a and 153b may be firmly attached to the selective contactor 155 by the magnetic force of the second closed loop LP2 stronger than the magnetic force of the first closed loop LP1.

Furthermore, the voltage of the voltage source may be changed.

Further, a switch SW may be positioned between the voltage source and the coil. The switch SW may function to selectively generate the current in the coil to selectively contact the magnetic force generator 151 with the selective contactor 155.

The probing needles 111 of the probe card 110 may be aligned with the test pads of the wafer W. When the voltage is applied to the voltage source and the switch SW is closed, the first closed loop LP1 of the magnetic force generator 151 may be opened so that the magnetic force generator 151 and the selective contactor 155 may magnetically contact each other.

For example, when the six magnetic modules 150 having magnetic energy of about 50 KgF may be arranged at a peripheral portion of the probe card 110, a magnetic force of about 300 KgF may be generated between the probe card 110 and the wafer W.

Therefore, the probe station of example embodiments may not include a driver for providing the wafer W and the probe card 110 with the force of no less than about 300 KgF.

Further, the probe card 110 and the wafer W may make contact with each other by the magnetic force so that the probe station may have a simple structure. Furthermore, contact accuracy between the probing needles and the test pads may be improved.

Figure 6:
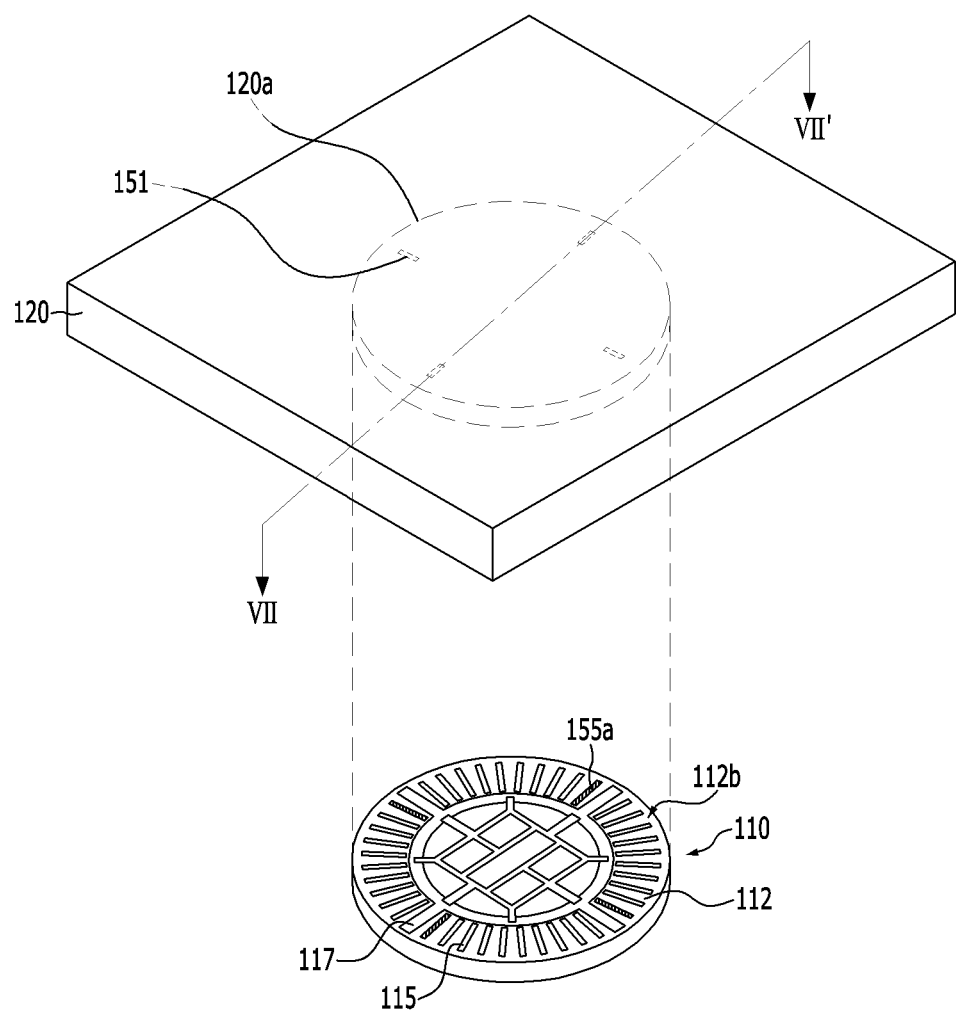
FIG. 6 is a perspective view illustrating a test head and a probe card in accordance with an embodiment of the present disclosure.
Figure 7:
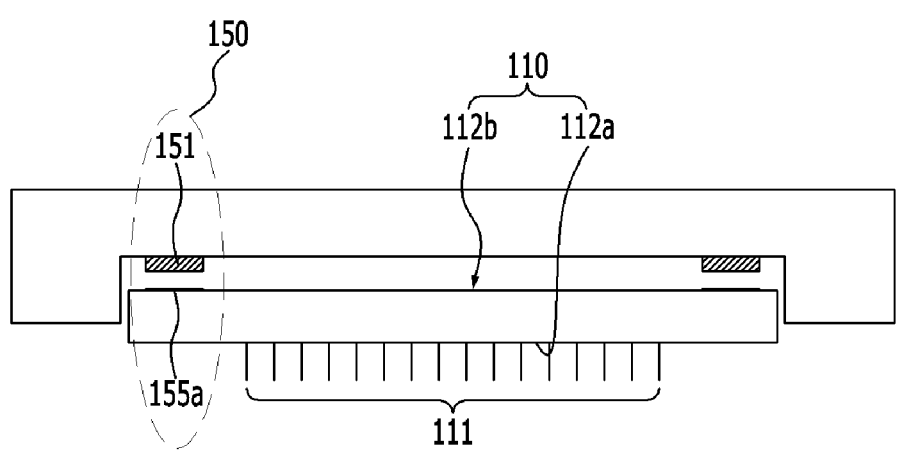
FIG. 7 is a cross-sectional view taken along a line VII-VII' in FIG. 6.

FIG. 6 is a perspective view illustrating a test head and a probe card in accordance with an embodiment of the present disclosure, and FIG. 7 is a cross-sectional view taken along a line VII-VII' in FIG. 6.

Referring to FIGS. 6 and 7, the test head 120 may be combined with the probe card 110 by the magnetic module 150.

For example, a magnetic force generator 151 may be installed at a receiver 120a of the test head 120 at which the probe card may be arranged. The magnetic force generator 151 may have a configuration substantially the same as that of the magnetic force generator 151 illustrated earlier. Thus, the magnetic force generator 151 may perform operations substantially the same as those of the magnetic force generator 151 illustrated earlier.

The second surface 112b of the probe card 110 may be attached to the surface of the receiver 120a. The second surface 112b of the probe card 110 may include a plurality of connectors 115 and a reinforcing member 117. The connectors 115 may be arranged in the circumferential direction of the substrate 112 by a uniform gap. The connectors 115 may include an electrical conductor. For example, the connector 115 may be made of a metal. The magnetic force generator 151 may be arranged facing the at least one connector 115. The connector 115 corresponding to the magnetic force generator 151 may be operated as a selective contactor 155a. In various embodiments, the connector 115 may be used as the selective contactor 155a magnetically combined with the magnetic force generator 151. It should be understood that the invention is not limited to the configuration shown in FIG. 6. Many different shapes and arrangements of metal connectors may be employed on the second surface 112a of the probe card 110 as the selective contactor 155a.

According to conventional technology, a conventional probe card and a conventional test head are mechanically combined with each other. However, the mechanical connection is subject to warpage which may be generated at a central portion and an edge portion of the probe card. As a result, contact failure may occur between the probing needles of the probe card and the test pads of the wafer.

According to various embodiments of the present invention, the test head 120 and the probe card 110 are combined with each other by a magnetic force without a mechanical combination. Thus, the probe station according to the present invention may have a simpler structure that is not subject to the shape distortion (warping) problem of the prior art and electrical connection failures.

Figure 8:
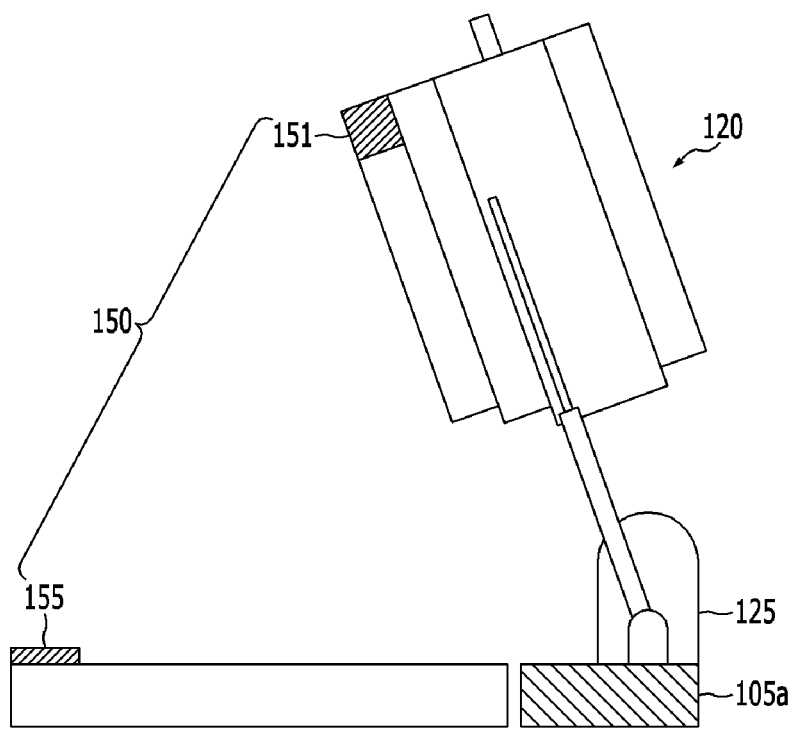
FIG. 8 is a cross-sectional view illustrating a probe station in accordance with an embodiment of the present disclosure.

FIG. 8 is a cross-sectional view illustrating a probe station in accordance with an embodiment of the present invention.

Referring to FIG. 8, one side of the test head 120 may be connected to one end of the chamber wall 105a by a hinge 125. Thus, the one side of the test head 120 may be opened and closed.

The test head 120 and the chamber wall 105 may be opened and closed by the magnetic module 150.

For example, the magnetic force generator 151 in FIG. 5A may be installed at a portion of the test head 120 or the chamber wall 105a. The selective contactor 155 may be installed at a portion of the test head 120 or the chamber wall 105a opposite to the portion at which the magnetic force generator 151 may be installed.

The magnetic force may be generated between the magnetic force generator 151 and the selective contactor 155 by applying the current to the coil of the controller 157. Thus, the test head 120 and the chamber wall 105a may effectively make contact with each other without a motor for generating a high driving force.

According to various embodiments, the probe card and the wafer (wafer supporting portion), the test head and the probe card, and the test head and the chamber wall may contact each other by the magnetic module so that the probe station may have a simple structure without a motor requiring the high driving force.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which are apparent in view of the present disclosure and which fall within the scope of the appended claims may be envisioned by those with ordinary skill in the art of the invention.

Various embodiments have been disclosed herein, and although specific terms are employed, they are used and are to be interpreted in a generic and descriptive sense and not for purpose of limitation. In some instances, as would be apparent to those skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor fabricating apparatus comprising:
a probe card including a plurality of probing needles;
a test head at which the probe card is installed;
a support configured to receive a wafer including a plurality of test pads, the test pads making contact with the probing needles; and
a chamber wall configured to define a chamber in which the support is positioned to perform a probe test,
wherein at least one of the probe card and the support, the probe card and the test head, and the test head and the chamber wall is combined with each other by a magnetic module,
wherein the magnetic module includes:
a magnetic force generator installed at one of the probe card and the support, one of the probe card and the test head, or one of the test head and the chamber wall, the magnetic force generator including a magnet, and a plurality of conductive blocks configured to form a first closed loop together with one surface of the magnet;
a selective contactor installed at the other one of the probe card and the support, the other one of the probe card and the test head, or the other one of the test head and the chamber wall; and
a controller configured to control a magnetic field line of the magnetic force generator.

2. The semiconductor fabricating apparatus of claim 1, wherein the selective contactor is opposite to the magnetic force generator.

3. The semiconductor fabricating apparatus of claim 2, wherein the probe card comprises a first surface facing the wafer and a second surface facing the test head, the first surface comprising a probing region in which the probing needles corresponding to the test pads of the wafer are arranged and an edge region configured to surround the probing region, and one of the magnetic force generator and the selective contactor is arranged in the edge region by a uniform gap.

4. The semiconductor fabricating apparatus of claim 3, wherein the support comprises:
a wafer supporting region configured to receive the wafer; and
an edge region configured to surround the wafer supporting region,
wherein the other one of the magnetic force generator and the selective contactor is arranged in the edge region to correspond to the magnetic force generator and the selective contactor in the probe card.

5. The semiconductor fabricating apparatus of claim 4, wherein the test head covers an upper surface of the chamber wall to define a sealed chamber, the test head and one side of the chamber wall are connected with each other by a hinge, and the test head and the other side of the chamber wall are selectively contacted with each other by the magnetic module.

6. The semiconductor fabricating apparatus of claim 3, wherein the second surface of the probe card comprises a plurality of connectors arranged in a circumferential direction of the probe card by a uniform gap, the test head comprises a receiver configured to receive the probe card, and the magnetic force generator is positioned in the receiver corresponding to the connectors to form the magnetic module with the connector.

7. The semiconductor fabricating apparatus of claim 4, wherein one of the magnetic force generator and the selective contactor is positioned at the other end of the test head opposite to the other end of the chamber wall, and the other one of the magnetic force generator and the selective contactor is positioned at the other end of the chamber wall opposite to the other end of the test head.

8. The semiconductor fabricating apparatus of claim 1, wherein at least one of the conductive blocks, which does not make contact with the magnet, is selectively attached and detached by the controller.

9. The semiconductor fabricating apparatus of claim 1, wherein the magnet comprises a permanent magnet having a north pole and a south pole.

10. The semiconductor fabricating apparatus of claim 1, wherein the conductive blocks comprise:
    a first block magnetically connected to one surface of the magnet;
    a second block magnetically connected to the other surface of the magnet; and
    a third block selectively connected to first ends of the first and second blocks to form the first closed loop.

11. The semiconductor fabricating apparatus of claim 10, wherein the selective contactor is magnetically connected to the second ends of the first and second blocks to form a second closed loop, which has a magnetic force line opposite to a magnetic force line of the first closed loop, together with the magnet and the conductive blocks making contact with the magnet by the controller.

12. The semiconductor fabricating apparatus of claim 11, wherein the selective contactor comprises a conductive material, and the selective contactor is connected to the second ends of the first and second blocks when the third block is detached from the first and second blocks.

13. The semiconductor fabricating apparatus of claim 1, wherein the controller comprises:
    a coil wound on one of the conductive blocks in contact with the magnet to generate a magnetic force opposite to the magnetic force of the first closed loop; and
    a voltage source configured to generate a current in the coil.

14. The semiconductor fabricating apparatus of claim 13, wherein the controller further comprises a switch configured to selectively supply the current between the coil and the voltage source.

15. A semiconductor fabricating apparatus comprising:
    a probe card including a probing region in which a plurality of probing needles is arranged and an edge region configured to surround the probing region;
    a support including a wafer supporting region where a wafer including a plurality of test pads, which contact with the probing needles, is received and an edge region configured to surround the wafer supporting region;
    a magnetic force generator arranged in the edge region of the probe card by a uniform gap;
    a selective contactor arranged facing the magnetic force generator in the edge region of the support; and
    a controller connected to the magnetic force generator to generate an attractive force and a repulsive force between the magnetic force generator and the selective contactor,
    wherein a magnetic force generator includes a magnet; and a plurality of conductive blocks configured to form a first closed loop together with one surface of the magnet, and
    wherein at least one of the conductive blocks which does not make contact with the magnet, is selectively attached and detached by the controller.

* * * * *